(12) United States Patent
Watanabe et al.

(10) Patent No.: US 8,810,047 B2
(45) Date of Patent: Aug. 19, 2014

(54) SEMICONDUCTOR DEVICE AND METHOD OF MANUFACTURING THE SAME

(75) Inventors: Mitsuhisa Watanabe, Tokyo (JP);
Fumitomo Watanabe, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 668 days.

(21) Appl. No.: 12/588,360

(22) Filed: Oct. 13, 2009

(65) Prior Publication Data
US 2010/0102438 A1    Apr. 29, 2010

(30) Foreign Application Priority Data

Oct. 24, 2008  (JP) ............................... P2008-274253

(51) Int. Cl.
*H01L 23/29* (2006.01)

(52) U.S. Cl.
USPC .......................................... 257/790

(58) Field of Classification Search
CPC .................................................. H01L 23/3135
USPC .......... 257/E23.069, 691, 698, 622, 777, 790; 438/622
See application file for complete search history.

(56) References Cited

U.S. PATENT DOCUMENTS

| | | | |
|---|---|---|---|
| 5,681,684 A * | 10/1997 | Kinashi et al. ............. | 430/280.1 |
| 6,538,317 B1 | 3/2003 | Miyata | |
| 6,573,612 B1 | 6/2003 | Miyata | |
| 7,528,480 B2 | 5/2009 | Mihara | |
| 7,777,350 B2 | 8/2010 | Sasaki et al. | |
| 2002/0151103 A1* | 10/2002 | Nakamura et al. ............ | 438/106 |
| 2003/0127734 A1* | 7/2003 | Lee et al. ...................... | 257/737 |
| 2006/0125077 A1 | 6/2006 | Akaike et al. | |
| 2006/0223236 A1* | 10/2006 | Nomura et al. ............... | 438/121 |
| 2006/0270211 A1* | 11/2006 | Nakamura et al. ............ | 438/622 |
| 2010/0044878 A1* | 2/2010 | Ha et al. ........................ | 257/777 |

FOREIGN PATENT DOCUMENTS

| | | |
|---|---|---|
| JP | H07-249733 A | 9/1995 |
| JP | 2001-44229 | 2/2001 |
| JP | 2001-44324 | 2/2001 |
| JP | 2002-329811 A | 11/2002 |
| JP | 2004-031562 A | 1/2004 |
| JP | 2004-063742 A | 2/2004 |
| JP | 2004-265955 A | 9/2004 |
| JP | 2006-100535 A | 4/2006 |
| JP | 2006-165466 A | 6/2006 |
| JP | 2007-180351 A | 7/2007 |
| JP | 2007-208153 A | 8/2007 |

OTHER PUBLICATIONS

An English translation of the Japanese Office Action dated Oct. 22, 2013.

* cited by examiner

*Primary Examiner* — Yu-Hsi D Sun
(74) *Attorney, Agent, or Firm* — McGinn IP Law Group, PLLC

(57) ABSTRACT

A semiconductor device includes: a substrate having first and second surfaces, the first surface comprising first and second regions; a first semiconductor chip covering the first region; a first seal covering the second region and the first semiconductor chip; and a second seal covering the second surface.

26 Claims, 13 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same.

Priority is claimed on Japanese Patent Application No. 2008-274253, filed Oct. 24, 2008, the content of which is incorporated herein by reference.

2. Description of the Related Art

Generally, a BGA (Ball Grid Array) semiconductor device, such as a semiconductor device 1 shown in FIG. 20, schematically includes: a wiring substrate 2 having a surface 2a on which multiple connection pads 3 are provided and a rear surface 2b on which multiple lands 4 electrically connected to the connection pads 3 are provided; a semiconductor chip 5 on the surface 2a of the wiring substrate 2; wires 7 electrically connecting multiple electrode pads 6 on the semiconductor chip 5 and the connection pads 3 on the wiring substrate 2; a seal 8 that is made of an insulating resin and covers at least the semiconductor chip 5 and the wires 7; and multiple solder balls 9 that are external terminals on the lands 4.

Generally, the BGA semiconductor device 1 is manufactured by an MAP (Mold Array Process) method for better productivity. Specifically, a wiring motherboard including multiple wiring substrates (element formation units) arranged in a matrix is processed, and is finally diced into multiple pieces of the element formation units to obtain multiple pieces of semiconductor devices.

There has been a problem in that the BGA semiconductor device 1 warps due to the difference in thermal expansion coefficients between the wiring substrate 2 and the seal 8. Particularly, in the MAP method of simultaneously manufacturing multiple semiconductor devices 1, multiple wiring substrates 2 included in a wiring motherboard are collectively covered by a seal, thereby causing more warpage due to the difference in thermal expansion coefficients between the wiring substrate 2 and the seal 8.

To solve the problem, Japanese Unexamined Patent, First Publication Nos. 2001-44229 and 2001-44324 disclose a method of dividing a seal for covering a wiring motherboard into two or more pieces in order to reduce a region to be simultaneously sealed.

However, in the disclosed method, element formation regions become small since a seal for covering the wiring motherboard is divided into two or more pieces, thereby degrading the productivity. Consequently, the number of semiconductor devices obtained from one wiring motherboard is reduced, thereby causing higher costs for manufacturing semiconductor devices.

Recently, demands for more miniaturized and thinned semiconductor devices have been increasing with increasing demands for more miniaturized and thinned mobile devices. Therefore, wiring substrates and semiconductor chips have been becoming thinner and thinner, thereby causing warpage of semiconductor devices obtained by dicing a thin wiring motherboard.

In other words, conventional semiconductor devices obtained by dicing do not warp since each semiconductor piece has rigidity and therefore can withstand stress due to the difference in thermal expansion coefficients. However, thinned semiconductor devices warp since each thinned semiconductor piece has less rigidity and therefore cannot withstand stress due to the difference in thermal expansion coefficients.

Such warpage of semiconductor devices might cause a poor connection such as a poor connection of solder balls when each semiconductor device is mounted on a motherboard. Particularly, a semiconductor device having a PoP (Package on Package) structure in which multiple semiconductor devices are stacked greatly warp.

SUMMARY

In one embodiment, there is provided a semiconductor device including a substrate, a first semiconductor chip, and first and second seals. The substrate has first and second surfaces. The first surface includes first and second regions. The first semiconductor chip covers the first region. The first seal covers the second region and the first semiconductor chip. The second seal covers the second surface.

In another embodiment, there is provided a method of manufacturing a semiconductor device. The method includes the following processes. A motherboard having first and second surfaces is prepared. The first surface includes a plurality of first regions and a second region. The second surface includes a plurality of third regions and a fourth region. A plurality of first semiconductor chips is provided to cover the plurality of first regions. A plurality of conductors is provided to cover the plurality of third regions. First and second seals are formed such that the first seal covers the plurality of first semiconductor chips and the second region, and the second seal covers at least the fourth region.

Accordingly, warpage of the semiconductor device can be reduced. In other words, the first seal expands and contracts together with the second seal. Therefore, a balance of thermal expansion coefficients between both sides of the wiring substrate is enhanced, thereby reducing warpage of the semiconductor device.

Consequently, enhancement of the mounting precision and an excellent electrical connection can be achieved, thereby enhancing the reliability of a second mounting of the semiconductor device.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will now be described herein with reference to illustrative embodiments. The accompanying drawings explain a semiconductor device and a method of manufacturing the semiconductor device in the embodiments. The size, the thickness, and the like of each illustrated portion might be different from those of each portion of an actual semiconductor device.

Those skilled in the art will recognize that many alternative embodiments can be accomplished using the teachings of the present invention and that the present invention is not limited to the embodiments illustrated herein for explanatory purposes.

Figure 1:
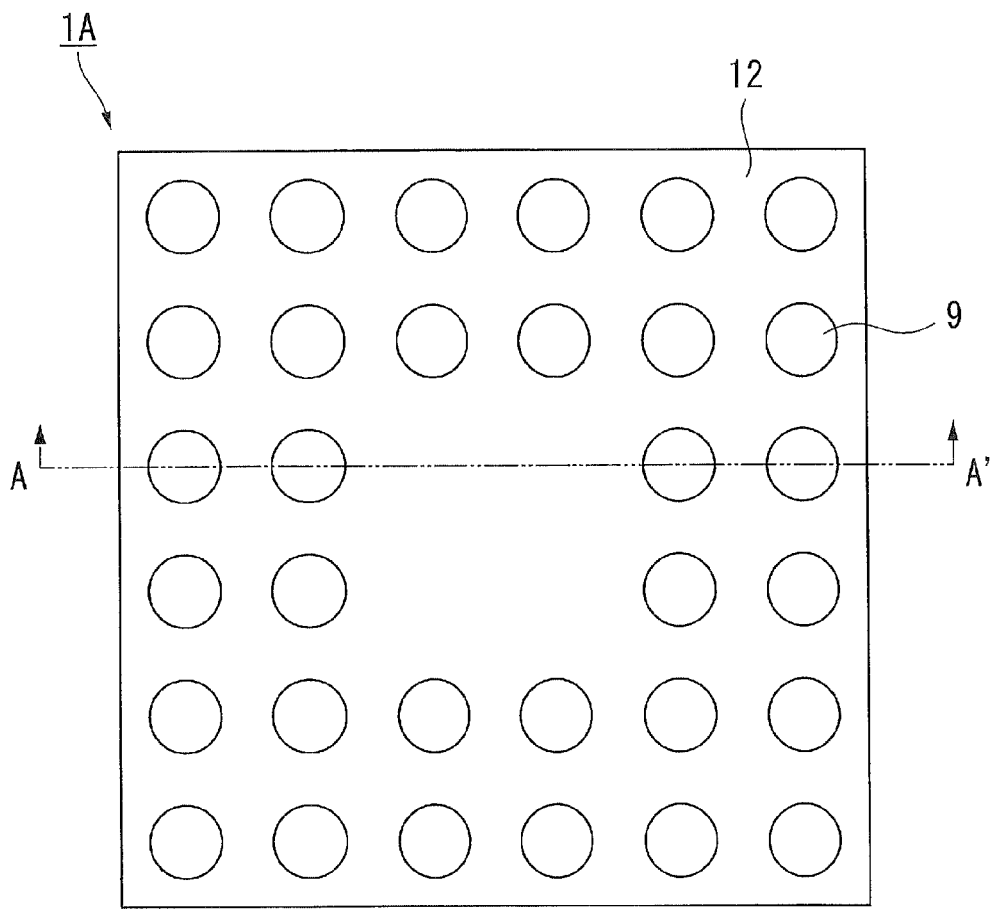
FIG. 1 is a plane view illustrating a rear surface of the semiconductor device according to a first embodiment of the present invention.
Figure 2:
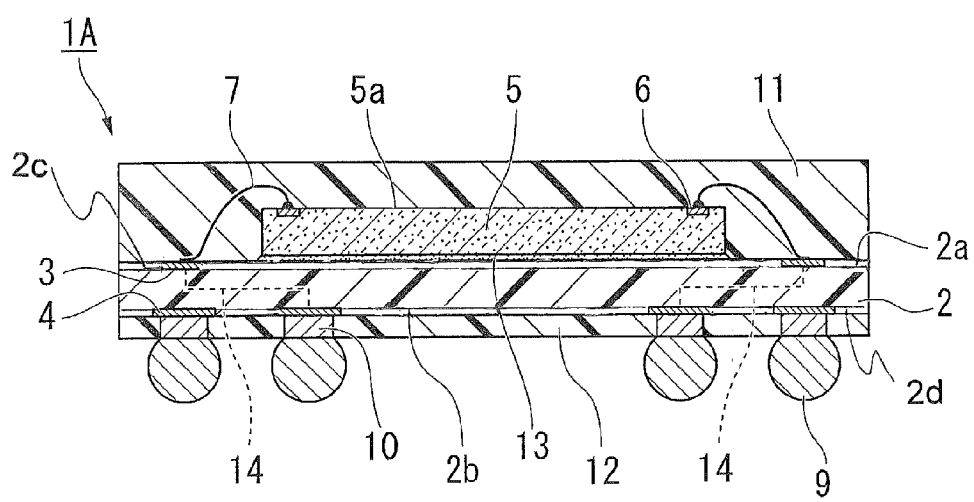
FIG. 2 is a cross-sectional view taken along a line A-A' shown in FIG. 1.

First Embodiment:

FIG. 1 is a plane view illustrating a rear surface (on the side of external terminals) of a semiconductor device 1A according to a first embodiment of the present invention. FIG. 2 is a cross-sectional view taken along a line A-A' shown in FIG. 1.

The semiconductor device 1A is a BGA semiconductor device and includes: a wiring substrate 2 that is substantially rectangular in plane view seen perpendicular to the wiring substrate 2; a semiconductor chip 5 on a surface 2a of the wiring substrate 2; conductors (external terminals) 10 on the rear surface of the wiring substrate 2; a first seal 11 covering the surface 2a of the wiring substrate 2; and a second seal 12 covering the rear surface 2b of the wiring substrate 2b. In the first embodiment, the conductors 10 and the solder balls 9 form external terminals.

The wiring substrate 2 is, for example, a glass epoxy substrate having a thickness of, for example, 0.2 mm. Given wires (now shown) are provided on both sides of the glass epoxy substrate. The wires are partially covered by an insulating film 2c and 2d, such as a solder resist film.

Multiple connection pads 3 are provided on the surface 2a of the wiring substrate 2 which is uncovered by the insulating film 2c (e.g., solder resist film). Multiple lands 4 are provided on the rear surface 2b of the wiring substrate 2 which is uncovered by the insulating film 2d (e.g., solder resist film).

The connection pads 3 are electrically connected to the corresponding lands 4 by wires 14 in the wiring substrate 2. Thus, the semiconductor chip 5 is connected to the lands 4 through the connection pads 3 and the wires. The lands 4 are arranged in a grid at a given pitch, such as a 1 mm pitch.

The semiconductor chip 5 is fixed onto the substantially center of the surface 2a of the wiring substrate 2 by a fixing member 13, such as an insulating adhesive or a DAF (Die Attached Film). The semiconductor chip 5 is substantially rectangular and has a surface 5a on which a desired circuit, such as a logic circuit or a memory circuit, is provided.

Multiple electrode pads 6 are provided on the surface 5a along the periphery of the semiconductor chip 5. To protect a circuit formation surface, a passivation film (not shown) is formed on the surface 5a of the semiconductor chip 5 excluding regions of the electrode pads 6.

The electrode pads 6 on the semiconductor chip 5 are electrically connected to the corresponding connection pads 3 on the wiring substrate 2 using the conductive wires 7 made of, for example, Au or Cu.

The first seal 11 is formed over substantially the entire surface 2a of the wiring substrate 2 to cover the semiconductor chip 5 and the wires 7. The first seal 11 is made of, for example, a thermosetting resin such as an epoxy resin. The first seal 11 has a thickness of, for example, 400 μm.

The cylindrical conductors 10 are formed on the corresponding lands 4 on the rear surface 2b of the wiring substrate 2. The conductor 10 is made of, for example, Cu plating and protrudes from the land 4 by 10 μm or more, for example, 50 μm.

The second seal 12 is formed over substantially the entire rear surface 2b of the wiring substrate 2 such that end portions of the conductors 10 are exposed. In other words, the second seal 12 covers the rear surface 2b of the wiring substrate 2 excluding regions of the conductors 10. The second seal 12 has a thickness of 10 μm or more, for example, 50 μm, so as to be identical to the thickness of the conductors 10.

The second seal 12 is made of a thermosetting resin such as an epoxy resin, similarly to the first seal 11. The second seal 12 is made of a material having the same thermal expansion coefficient as that of a material forming the first seal 11, so that the materials having the same thermal expansion coefficient sandwiches the wiring substrate 2.

The solder balls 9 forming external terminals are mounted on the corresponding conductors 10 exposed from the surface of the second seal 12. Thus, the solder balls 9 forming the external terminals are connected to the corresponding lands 4 through the conductors 10 forming the same external terminals. Consequently, the external terminals penetrate the second seal 12 and connect to the corresponding lands 4.

Thus, the first and second seals 11 and 12 cover substantially the entire surfaces 2a and 2b of the wiring substrate 2, respectively. Accordingly, a balance of thermal expansion between both sides of the wiring substrates 2 is improved, thereby enabling a reduction in warpage of the semiconductor device 1A. Consequently, the precision of mounting the semiconductor device 1A onto a motherboard or the like is enhanced, and a better electrical connection can be achieved. Therefore, the reliability of a second mounting of the semiconductor device 1A is enhanced.

The conductors 10 having a given thickness are provided on the corresponding lands 4 of the wiring substrate 2 so that the solder balls 9 are positioned separately from the wiring substrate 2. For this reason, a distance between the semiconductor chip 5 and a mounting substrate such as a motherboard becomes larger.

Consequently, stress applied to the semiconductor chip 5 which is caused by a distortion of the mounting substrate can be reduced, thereby enhancing the reliability of a second mounting. Additionally, crosstalk noise between the wiring substrate 2 and the mounting substrate can be reduced, thereby enhancing the electric characteristics of the semiconductor device 1A.

The seal 12 having a given thickness is provided to cover substantially the entire rear surface 2b of the wiring substrate 2. Accordingly, wires on the rear surface 2b of the wiring substrate 2 can be protected, thereby enhancing the mechanical strength of the semiconductor device 1A.

In the semiconductor device 1A of the first embodiment, the first seal 11 is thicker than the second seal 12. Additionally, the first seal 11 is made of the same material forming the second seal 12. Therefore, the first seal 11 thermally expands greater than the second seal 12.

For this reason, an insulating resin forming the first seal 11 preferably has a smaller thermal expansion coefficient than that of an insulating resin forming the second seal 12. Thus, the balance of thermal expansion between both sides of the wiring substrate 2 is further improved, thereby further reducing warpage of the semiconductor device 1A.

Figure 3A:
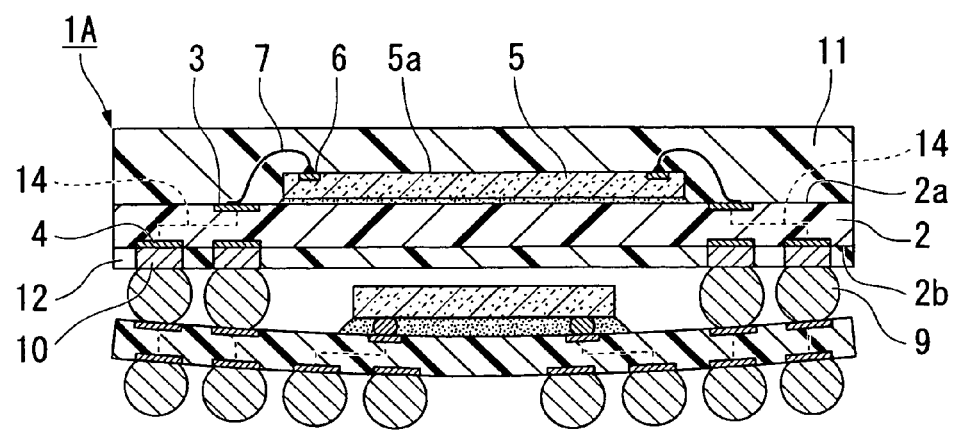
FIGS. 3A and 3B are cross-sectional views illustrating a semiconductor device having a PoP structure according to the first embodiment.
Figure 3B:
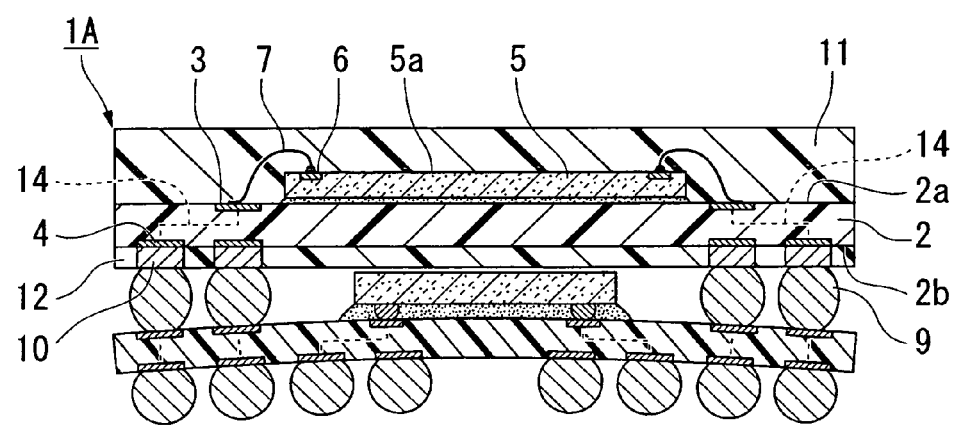

FIGS. 3A and 3B are cross-sectional views illustrating a semiconductor device having a PoP structure in which the semiconductor device 1A of the first embodiment is stacked on another semiconductor device.

Warpage of the semiconductor device 1A of the first embodiment is reduced by providing the first and second seals 11 and 12 covering the surfaces 2a and 2b of the wiring substrate 2. For this reason, a better electrical connection between the semiconductor device 1A and the other semiconductor device can be achieved regardless of the warpage direction of the other semiconductor device, as shown in FIGS. 3A and 3B.

Hereinafter, a method of manufacturing the semiconductor device 1A according to the first embodiment is explained.

Figure 4:
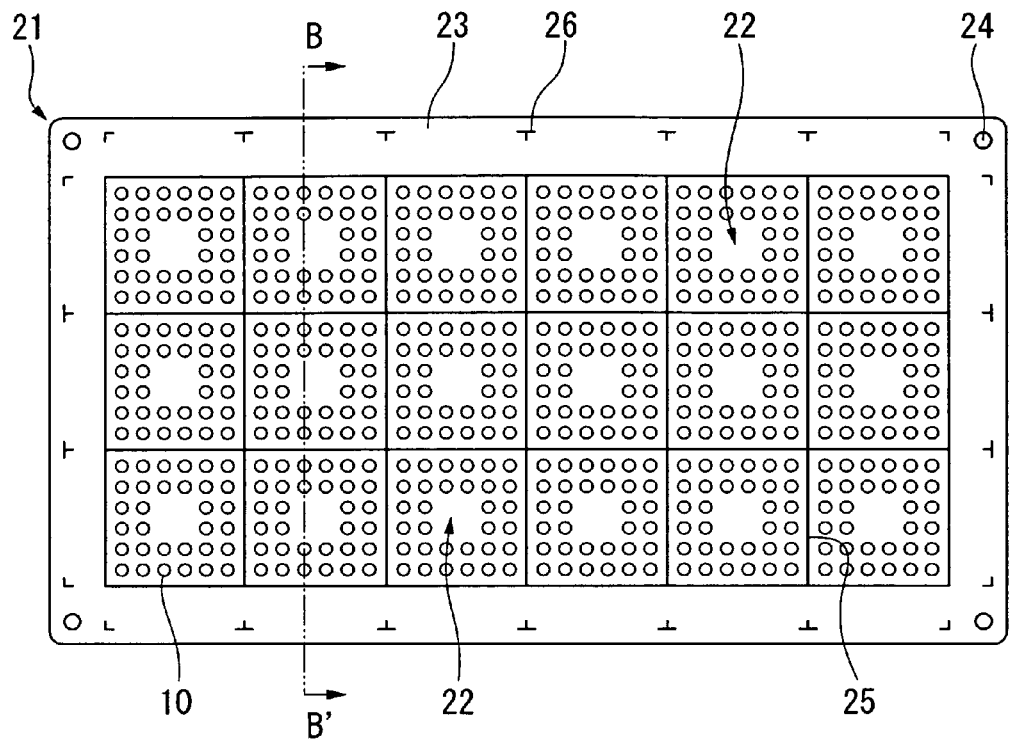
FIG. 4 is a plane view illustrating a rear surface of a wiring motherboard used for manufacturing the semiconductor device according to the first embodiment.
Figure 5:
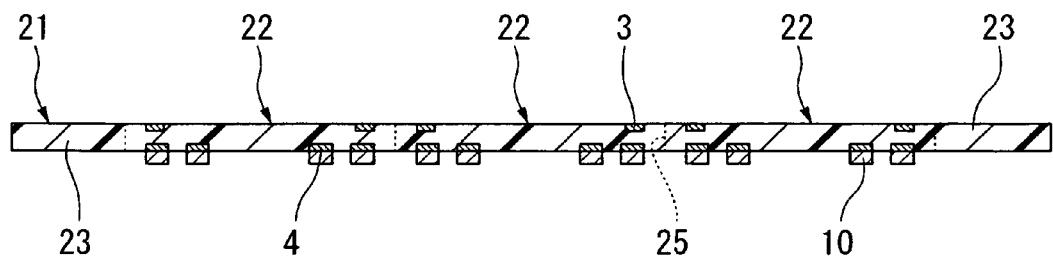
FIG. 5 is a cross-sectional view taken along a line B-B' shown in FIG. 4.

FIG. 4 is a plane view illustrating a rear surface of a wiring substrate used for manufacturing the semiconductor device 1A. FIG. 5 is a cross-sectional view taken along a line B-B' shown in FIG. 4. FIGS. 6A to 6E, and 7A to 7C are cross-sectional views indicative of a process flow illustrating a method of manufacturing the semiconductor device 1A. FIG. 8 is a plane view illustrating a rear surface of the wiring motherboard after formation of the seals.

As shown in FIGS. 4 and 5, the wiring motherboard 21 used in the first embodiment is processed by the MAP (Mold Array Process) method, and includes multiple element formation units 22 arranged in a matrix. Each of the element formation units 22 will be the wiring substrate 2 after dicing, and has the same structure as that of the wiring substrate 2. Therefore, explanations thereof are omitted here.

In the first embodiment, the cylindrical conductors 10 are preliminarily formed on the corresponding lands 4. The cylindrical conductors 10 are made of a metal plating, such as a Cu plating, and have a predetermined height of 10 μm or more, for example, 50 μm.

A frame 23 is provided to surround the element formation units 22 arranged in a matrix. The frame 23 has positioning holes 24 at a given interval for handling and positioning.

Boundaries among the element formation units 22 are dicing lines 25 along which the element formation units 22 are diced in a following process. The frame 23 has positioning marks 26 for dicing so that the dicing lines 25 can be recognized after formation of second seal 12 on the rear surface 2b of the wiring substrate 2.

Figure 6A:
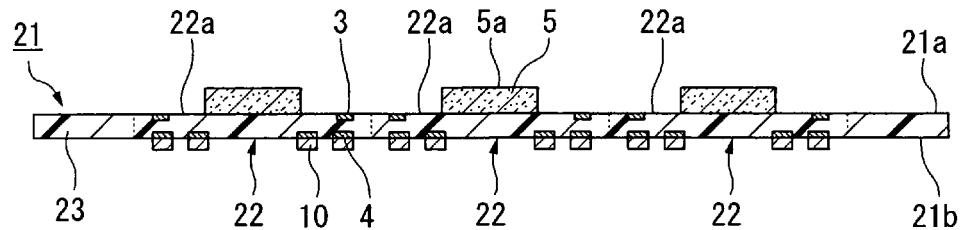
FIGS. 6A to 6E, and 7A to 7C are cross-sectional views indicative of a process flow illustrating a method of manufacturing the semiconductor device according to the first embodiment.

Then, the wiring motherboard 21 is subjected to a die-bonding process. In this process, the semiconductor chip 5 is fixed through the fixing member 13 shown in FIG. 2 onto substantially the center of the surface 22a of each element formation unit 22 using a die bonding apparatus (not shown), as shown in FIG. 6A. The fixing member 13 is, for example, an insulating adhesive or a DAF (Die Attached Film).

Figure 6B:
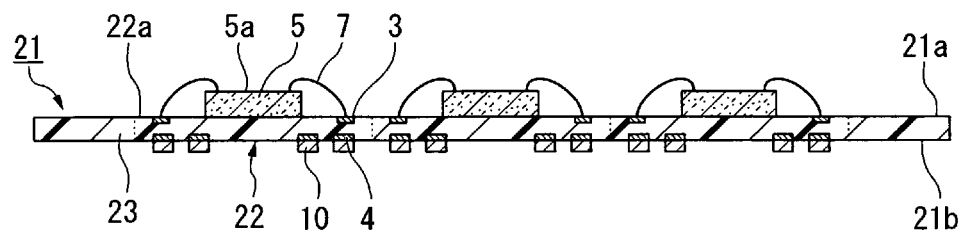

After the die-bonding process, the wiring motherboard 21 is subjected to a wire-bonding process. In this process, the electrode pads 6 along the periphery of the surface 5a of the semiconductor chip 5 are connected to the corresponding connection pads 3 on the element formation unit 22 using the wires 7, as shown in FIG. 6B.

Specifically, the wire 7 whose edge is melted to be in a ball shape is connected by ultrasonic thermocompression to the corresponding electrode pad 6 on the semiconductor chip 5 using a wire-bonding apparatus (now shown). Then, the wire 7 is looped, and the other edge of the wire 7 is connected by ultrasonic thermocompression to the corresponding connection pad 3. The wire 7 is made of, for example, Au or Cu.

After all the electrode pads 6 are connected to the corresponding connection pads 3 through the wires 7, the wiring motherboard 21 is subjected to a sealing process to form seals on both sides of the wiring motherboard 21.

Figure 7A:
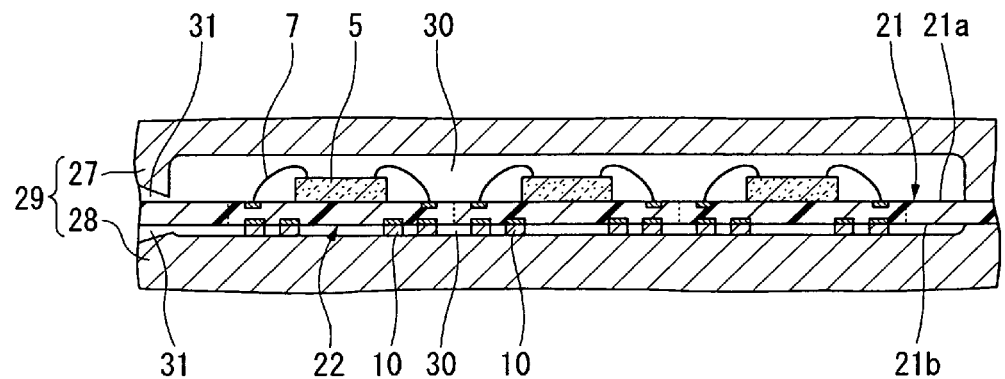
Figure 8:
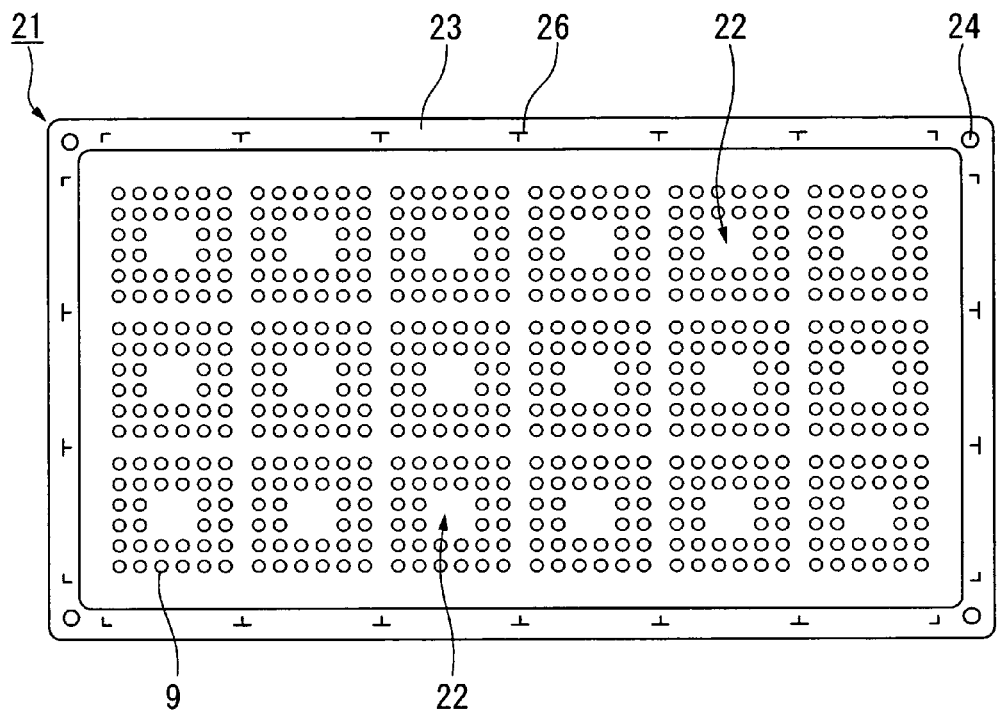
FIG. 8 is a plane view illustrating the rear surface of the wiring motherboard used for manufacturing the semiconductor device according to the first embodiment.

In the sealing process, the wiring motherboard 21 is fixed to a mold 29 of a transfer mold apparatus including an upper mold 27 and a lower mold 28, as shown in FIG. 7A. The upper and lower molds 27 and 28 include cavities 30. The wiring motherboard 21 is fixed onto the mold 29 so that end portions of the conductors 10 on the rear surface 21b of the wiring motherboard 21 are fixed onto the lower mold 28.

The end portions of the conductors 10 may be fixed onto the lower mold 28 through an elastic sheet in order to prevent a seal resin from flowing into gaps between the end portions of the conductors 10 and the lower mold 28. Thus, the conductors 10 can be exposed from the second seal 12.

Figure 7B:
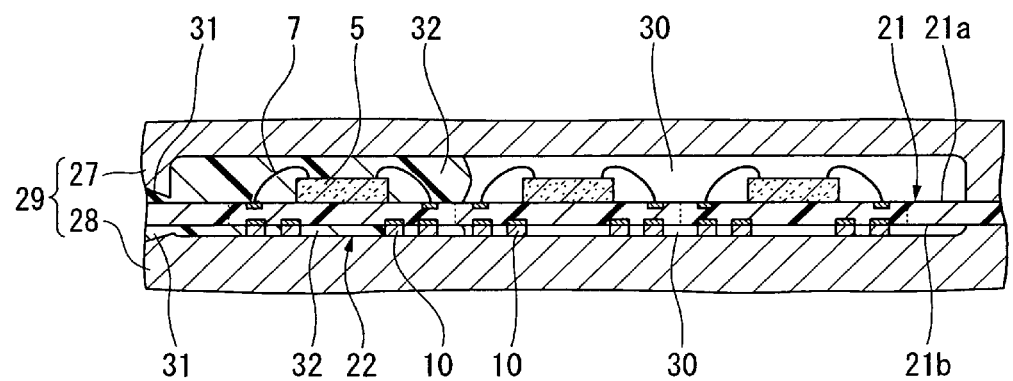

Each of the upper and lower molds 27 and 28 includes a gate 31 through which a seal resin 32 which is heated to be melted is provided to the upper and lower cavities 30, as shown in FIG. 7B. The seal resin 32 is a thermosetting resin, such as an epoxy resin.

Although not shown, upper cull and runner portions for the seal resin 32 provided into the upper cavity 30 may be disposed at different positions from lower cull and runner portions so that the cull and runner portions can be easily removed from the wiring motherboard 21 after sealing.

Figure 7C:
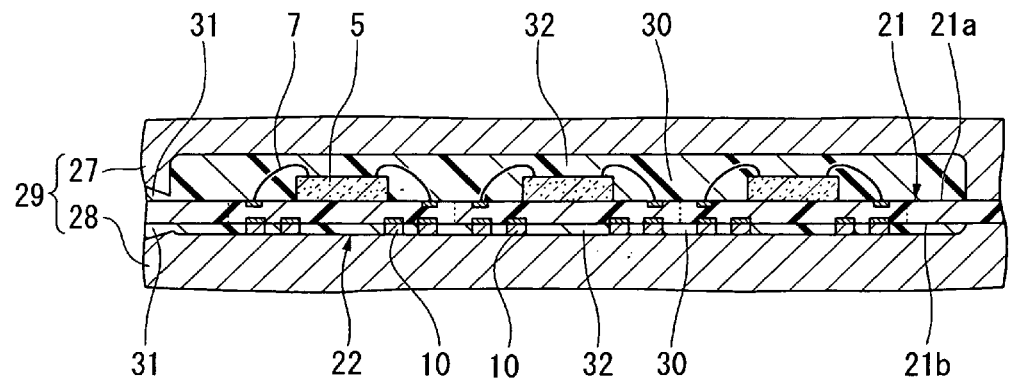

Then, the seal resin 32 completely filling the upper and lower cavities 30 is thermally cured at a given temperature, for example 180° C., as shown in FIG. 7C.

Figure 6C:
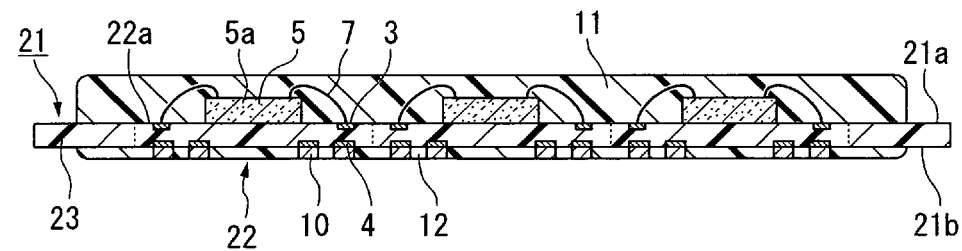

Thus, the first and second seals 11 and 12 collectively covering the multiple element formation units 22 of the wiring motherboard 21 are formed, as shown in FIG. 6C. Then, the wiring motherboard 21 is reflowed at a given temperature, for example, at 240° C., to cure the first and second seals 11 and 12.

Since the end portions of the cylindrical conductors 10 are fixed onto the lower mold 28, the end portions of the conductors 10 are exposed from the second seal 12 covering the rear surface 21b of the wiring motherboard 21.

As explained above, the first and second seals 11 and 12 are formed to cover the surfaces 21a and 21b of the wiring motherboard 21. Accordingly, a balance of thermal expansion between both sides of the wiring substrate 21 can be improved, thereby enabling a reduction in warpage of the wiring motherboard 21.

Additionally, the upper and lower cavities 30 are provided so that the seal resin 32 can simultaneously fill the upper and lower cavities 30. Accordingly, the second seal 12 can be formed without additional processes.

Further, the conductors 10 have a thickness of 10 μm or more. Accordingly, the seal resin 32 can be provided into the cavities 30.

Moreover, each of the upper and lower molds 27 and 28 has the cavity 30 so that the element formation units 22 are collectively sealed. Accordingly, the seal resin 32 can be efficiently provided into the upper and lower cavities 30. If the size of the wiring motherboard 21 is standardized, the mold 29 can be used for the wiring motherboard 21 including element formation units 22 having the different size, thereby enabling a reduction in manufacturing costs.

After the sealing process, the wiring motherboard 21 covered by the first and second seals 11 and 12 is subjected to a ball-mounting process.

Figure 6D:
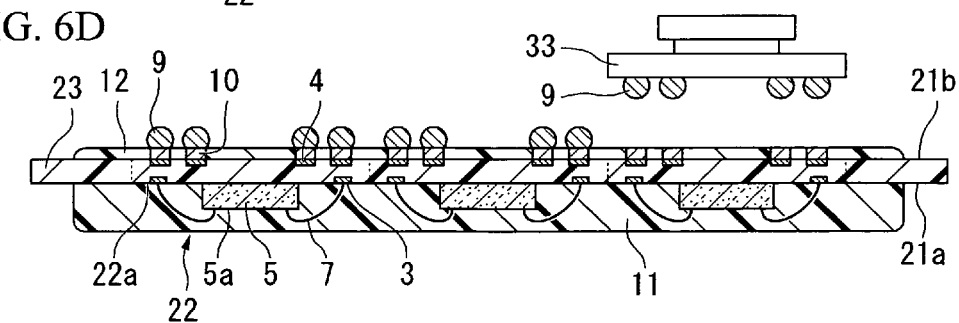

In this process, conductive metal balls are mounted on the conductors 10 exposed from the second seal 12 to form bump electrodes which will be external terminals, as shown in FIG. 6D. The metal balls are, for example, the solder balls 9.

Specifically, the solder balls 9 are held by suction using a ball mounting tool 33 including multiple suction holes positioned so as to correspond to the exposed surfaces of the conductors 10. Then, a flux is applied to the held solder balls 9. Then, the solder balls 9 are collectively mounted on the exposed surfaces of the conductors 10.

After the solder balls 9 are mounted on all the element formation units 22, the wiring motherboard 21 is reflowed to form bump electrodes that will be external terminals.

In the first embodiment, a balance of thermal expansion between both sides of the wiring motherboard 21 is improved, and therefore warpage of the wiring motherboard 21 is reduced. Accordingly, the solder balls 9 can be mounted on the element formation units 22 with higher precision.

Since warpage of the wiring motherboard 21 is reduced, the solder balls 9 can be collectively mounted on all the element formation units 22, thereby enhancing the processing efficiency.

After the ball-mounting process, the wiring motherboard 21 on which the solder balls 9 are mounted is subjected to a dicing process.

Figure 6E:
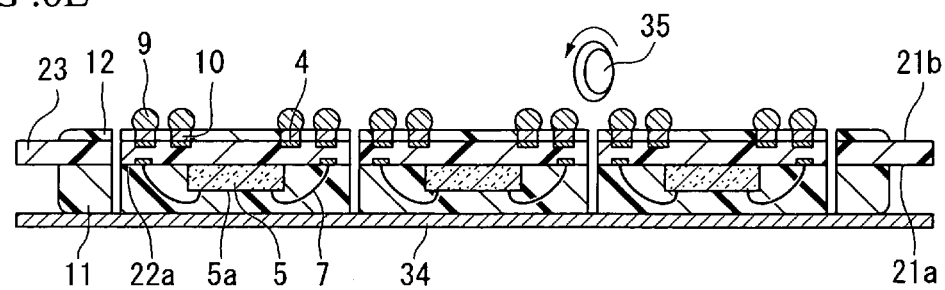

In this process, the wiring motherboard 21 is divided into multiple pieces of the element formation units 22, as shown in FIG. 6E. Specifically, the wiring motherboard 21 on the side of the first seal 11 is fixed on a dicing tape 34. Then, the wiring motherboard 21 is horizontally and vertically diced by a dicing blade 35 of a dicing apparatus (not shown) into pieces of the element formation units 22.

As shown in FIG. 8, the second seal 12 collectively covers the element formation units 22 on the rear surface 21b of the wiring motherboard 21, and therefore covers the boundaries among the element formation units 22. However, thanks to the dicing marks 26 on the frame 23, the dicing positions can be recognized, thereby enabling dicing of the element formation units 22.

After the dicing, each piece of the element formation units 22 is picked up from the dicing tape 34, and thus the semiconductor device whose warpage is reduced as shown in FIGS. 1 and 2 can be obtained.

In the first embodiment, thanks to the first and second seals 11 and 12 on the surfaces 21a and 21b of the wiring motherboard 21, a balance of thermal expansion between both sides of the wiring motherboard 21 is improved, and therefore warpage of the wiring motherboard 21 is reduced. Accordingly, the wiring motherboard 21 can be precisely diced into pieces of element formation units 22.

Figure 9:
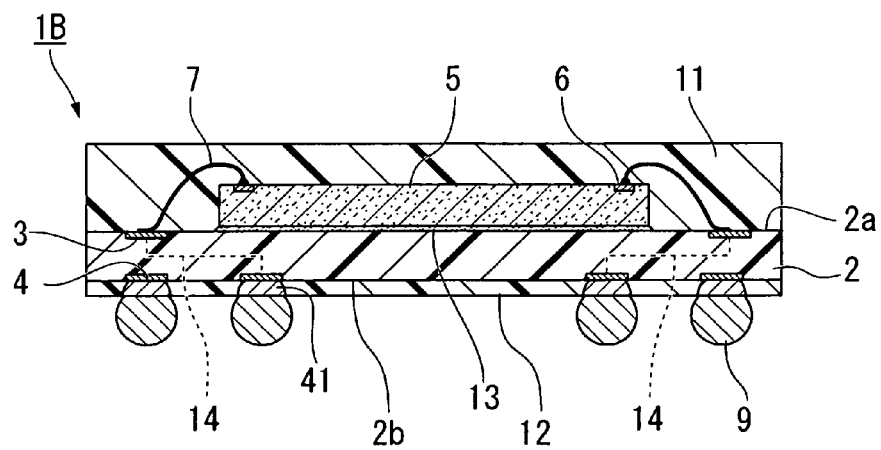
FIG. 9 is a cross-sectional view illustrating a semiconductor device according to a second embodiment of the present invention.

Second Embodiment:

FIG. 9 is a cross-sectional view illustrating a semiconductor device 1B according to a second embodiment of the present invention. The second embodiment is a modification of the first embodiment, and therefore explanations of like elements are omitted here.

Similar to the first embodiment, the semiconductor device 1B includes the first and second seals 11 and 12 covering substantially the entire surfaces 2a and 2b of the wiring substrate 2.

In the semiconductor device 1B, conductors 41 (external terminals) on the rear surface 2b of the wiring substrate 2 are made of solder balls (external terminals). In other words, the conductors 41 and the solder balls 9 are made of the same material and form external terminals. For this reason, the external terminals penetrate the second seal 12 and connect to the lands 4.

Similar to the first embodiment, in the second embodiment, a balance of thermal expansion between both sides of the wiring substrate 2 is improved, thereby enabling a reduction in warpage of the semiconductor device 1B. Additionally, the conductors 41 and the solder balls 9 are made of the same material, thereby enabling a better connection between the conductors 41 and the solder balls 9.

Hereinafter, a method of manufacturing the semiconductor device 1B according to the second embodiment is explained.

FIGS. 10A to 10F are cross-sectional views indicative of a process flow illustrating a method of manufacturing the semiconductor device 1B according to the second embodiment. The second embodiment is a modification of the first embodiment, and therefore explanations of like processes are omitted here.

Figure 10A:
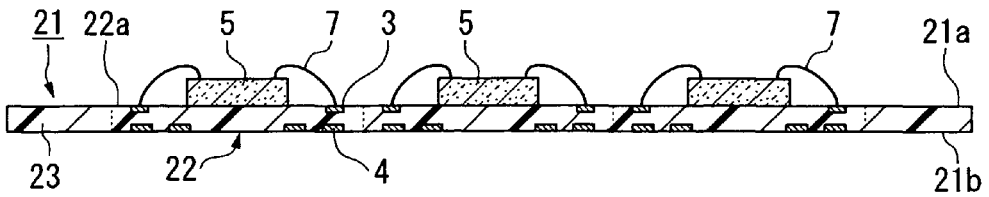
FIGS. 10A to 10F are cross-sectional views indicative of a process flow illustrating a method of manufacturing the semiconductor device according to the second embodiment.

As shown in FIG. 10A, the wiring motherboard 21 is prepared similarly to the first embodiment. At this time, conductors are not formed on the lands 4 on the wiring motherboard 21 of the second embodiment.

Then, the semiconductor chip 5 is mounted on each of the element formation units 22 of the wiring motherboard 21 similarly to the first embodiment (chip mounting process). Then, the connection pads 3 on the element formation unit 22 and the electrode pads 6 on the semiconductor chip 5 shown in FIG. 9 are electrically connected using the wires 7 (wire-bonding process).

Figure 10B:
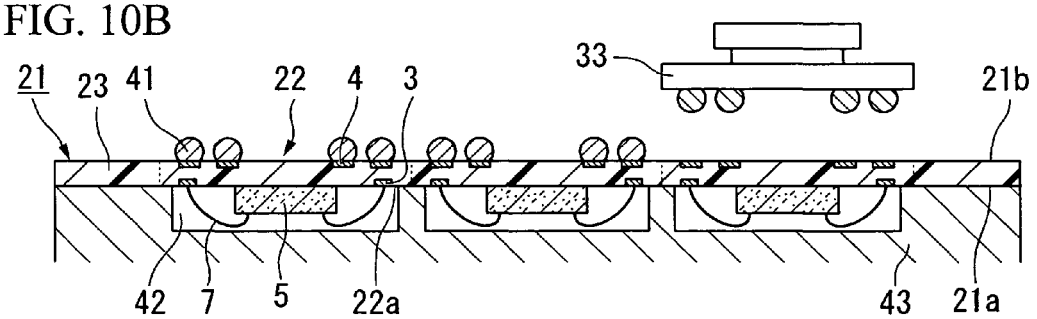

After the wire-boding process, the wiring motherboard 21 is subjected to a ball mounting process. In this process, the surface 21a of the wiring motherboard 21 is placed on a stage 43 including multiple recesses 42 positioned so as to correspond to the element formation units 22, as shown in FIG. 10B.

Then, solder balls are mounted on the corresponding lands 4 on the rear surface 21b of the wiring motherboard 21 using the ball mounting tool 33 to form conductors 41. In other words, the solder balls are used for the conductors 41 in the second embodiment.

Figure 10C:
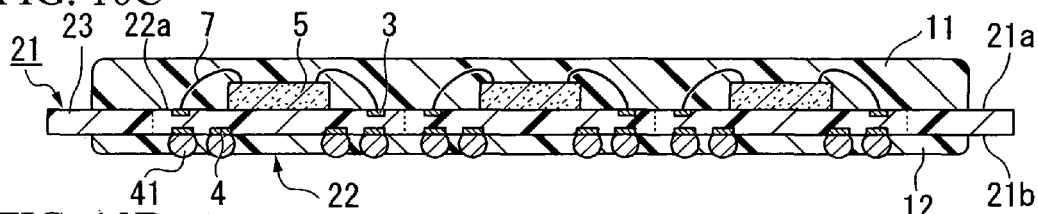
Figure 10D:
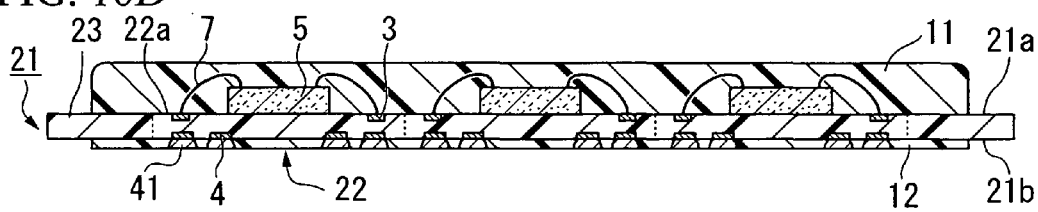

Then, the wiring motherboard 21 with the conductors 41 mounted on the lands 4 is subjected to a sealing process. As shown in FIG. 10C, the first and second seals 11 and 12 are formed to cover the surfaces 21a and 21b of the wiring motherboard 21. In the second embodiment, the conductors 41 on the rear surface 21b of the wiring motherboard 21 do not have to be fixed on the lower mold 28 shown in FIG. 7.

Then, the second seal 12 is ground by a given amount using a grinding apparatus (not shown) so that the conductors 41 are exposed from the second seal 12.

Thus, the conductors 41 are exposed from the second seal 12 and made flat, thereby making the semiconductor device 1B flatter.

Figure 10E:
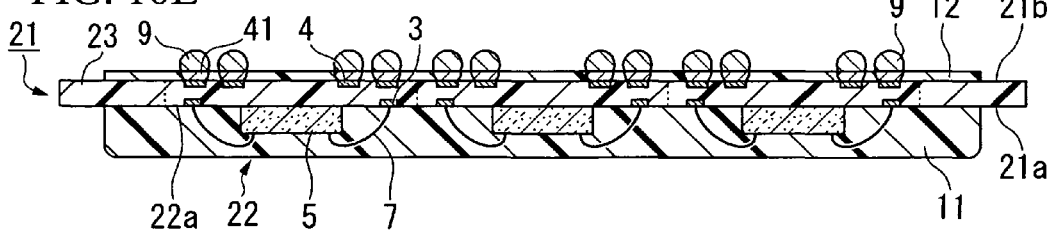

After the sealing process, the wiring motherboard 21 is subjected to a ball mounting process. In this process, the solder balls 9 are mounted on the exposed surfaces of the conductors 41 on the rear surface 21b of the wiring motherboard 21 to form bump electrodes that will be external terminals, as shown in FIG. 10E.

Thus, the conductors 41 and the solder balls 9 are made of the same material, thereby enabling a better connection between the conductors 41 and the solder balls 9.

Figure 10F:
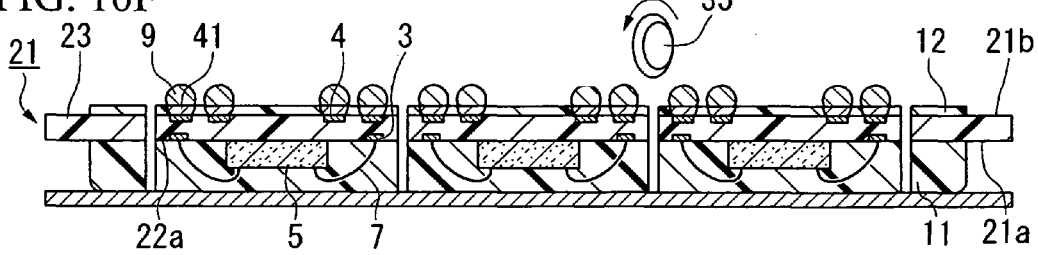

Then, the wiring motherboard 21 with the solder balls 9 is subjected to a dicing process. Similar to the first embodiment, the wiring motherboard 21 is diced into pieces of the element formation units 22 as shown in FIG. 10F, and thus the semiconductor device 1B whose warpage is reduced as shown in FIG. 9 can be obtained.

Figure 11:
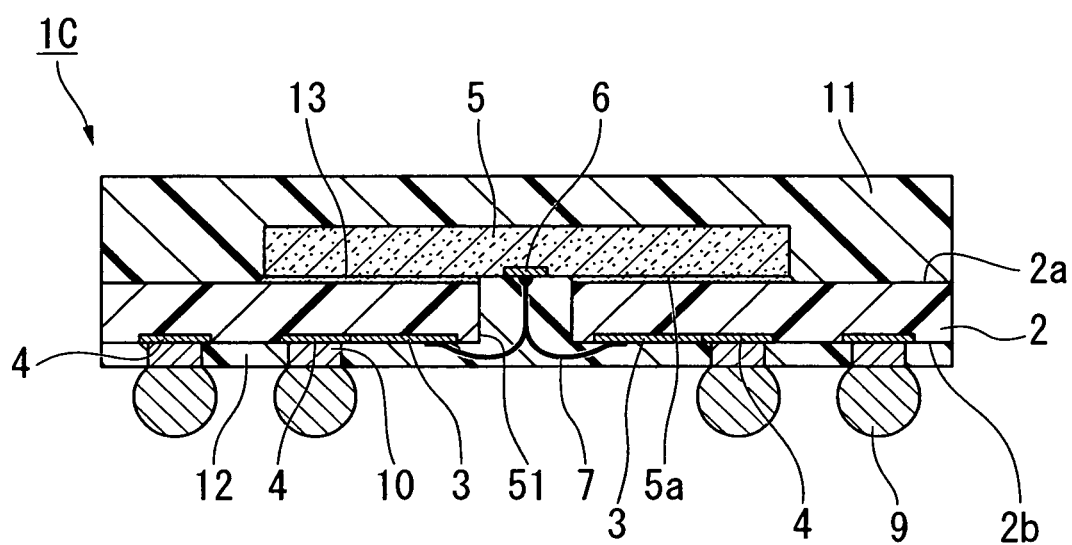
FIG. 11 is a cross-sectional view illustrating a semiconductor device according to a third embodiment of the present invention.
Figure 12:
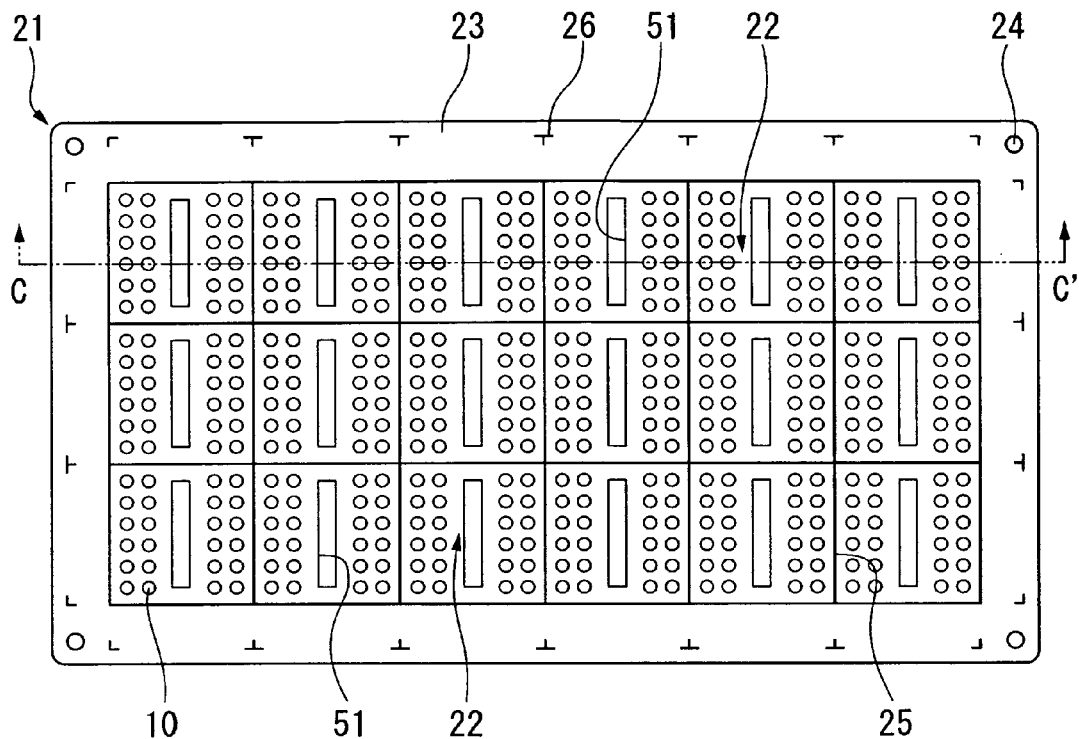
FIG. 12 is a plane view illustrating a rear surface of a wiring motherboard used for manufacturing the semiconductor device according to the third embodiment.
Figure 13:
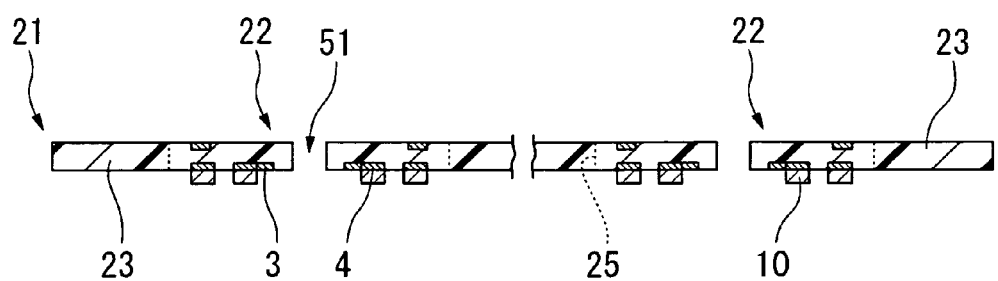
FIG. 13 is a cross-sectional view taken along a line C-C' shown in FIG. 13.

Third Embodiment:

FIG. 11 is a cross-sectional view illustrating a semiconductor device 1C according to a third embodiment of the present invention. FIG. 12 is a plane view illustrating a rear surface of a wiring motherboard used for the semiconductor device 1C. FIG. 13 is a cross-sectional view taken along a line C-C' shown in FIG. 12. The third embodiment is a modification of the first embodiment, and therefore explanations of like elements are omitted here.

The semiconductor device 1C includes a wiring substrate similar to the one of the first embodiment. However, a through slit 51 that is substantially rectangular is formed in substantially the center of the wiring substrate 2 (each element formation unit 22), as shown in FIGS. 11 to 13. If planarly viewed, the through slit 51 extends in the direction parallel to sides of the wiring substrate 2. The connection pads 3 are provided on the rear surface 2b of the wiring substrate 2 along the through slit 51. The connection pads 3 are electrically connected to the lands 4 using wires.

The semiconductor chip 5 is provided on substantially the center of the surface 2a of the wiring substrate 2. Multiple electrode pads 6 are aligned on substantially the center of the surface 5a of the semiconductor chip 5.

The semiconductor chip 5 is mounted on the wiring substrate 2 through the insulating fixing member 13 such as a DAF such that the surface 5a of the semiconductor chip 5 faces the wiring substrate 2 and the electrode pads 6 are positioned in the through slit 51.

The electrode pads 6 on the semiconductor chip 5 are electrically connected to the corresponding connection pads 3 on the rear surface 2b of the wiring substrate 2 using the conductive wires 7 passing through the through slit 51.

The first seal 11 is formed to cover substantially the entire surface 2a of the wiring substrate 2 and the semiconductor chip 5. Similar to the first embodiment, the cylindrical conductors (external terminals) 10 are provided on the corresponding lands 4 on the rear surface 2b of the wiring substrate 2.

The second seal 12 is formed to cover substantially the entire rear surface 2b of the wiring substrate 2, the wires 7, and the through slit 51 such that the end portions of the conductors 10 are exposed from the second seal 12.

The solder balls 9 forming external terminals are mounted on the exposed surface of the corresponding conductors (external terminals) 10. Thus, the external terminals penetrate the second seal 12 and connect to the corresponding lands 4.

In the semiconductor device 1C of the third embodiment, the first and second seals 11 and 12 are formed to cover substantially the entire surfaces 2a and 2b of the wiring substrate 2. Accordingly, a balance of thermal expansion between both sides of the wiring substrate 2 can be improved, and therefore warpage of the semiconductor device 1C can be reduced, similarly to the first embodiment.

Additionally, the semiconductor chip 5 is mounted on the wiring substrate 2 such that the electrode pads 6 faces the wiring substrate 2, thereby making the semiconductor device 1C thinner.

Further, thanks to the through slit 51 in the wiring substrate 2, the connection area of the wiring substrate 2 and the second seal 12 increases, thereby enhancing the adhesion. Consequently, the humidity resistance of the semiconductor device 1C can be enhanced.

Figure 14:
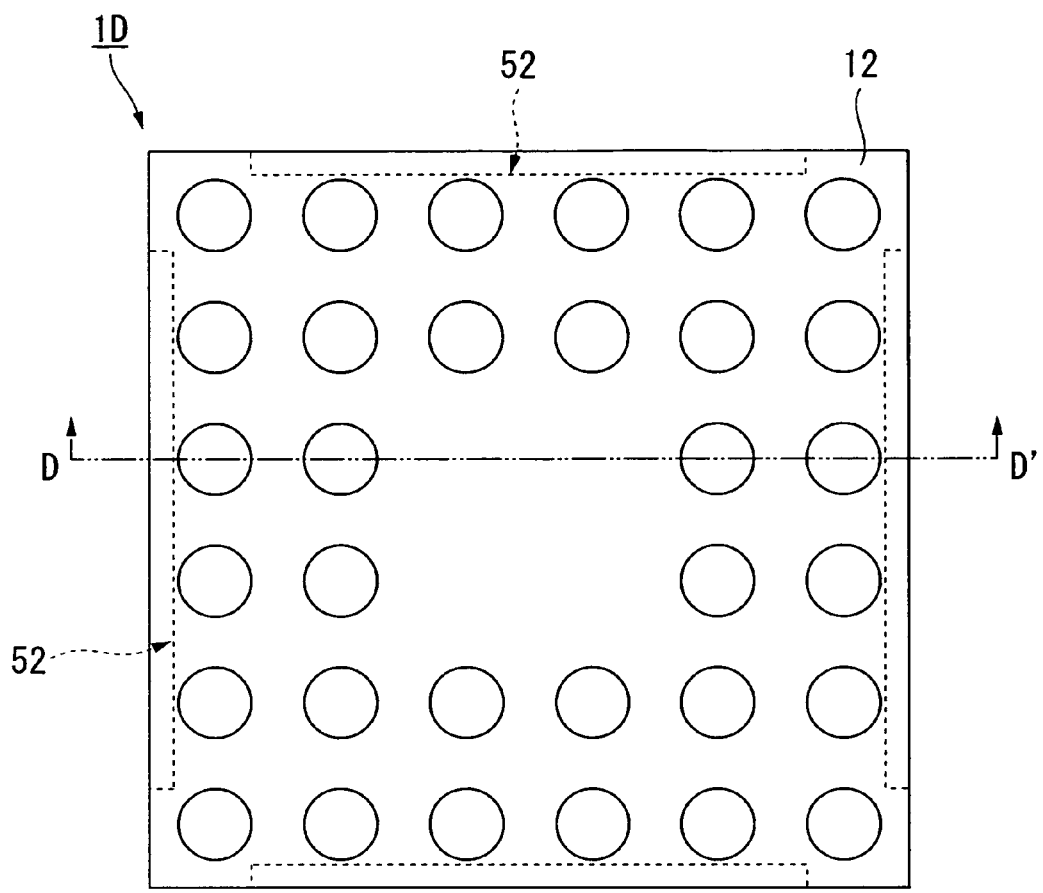
FIG. 14 is a plane view illustrating a rear surface of a semiconductor device according to a fourth embodiment of the present invention.
Figure 15:
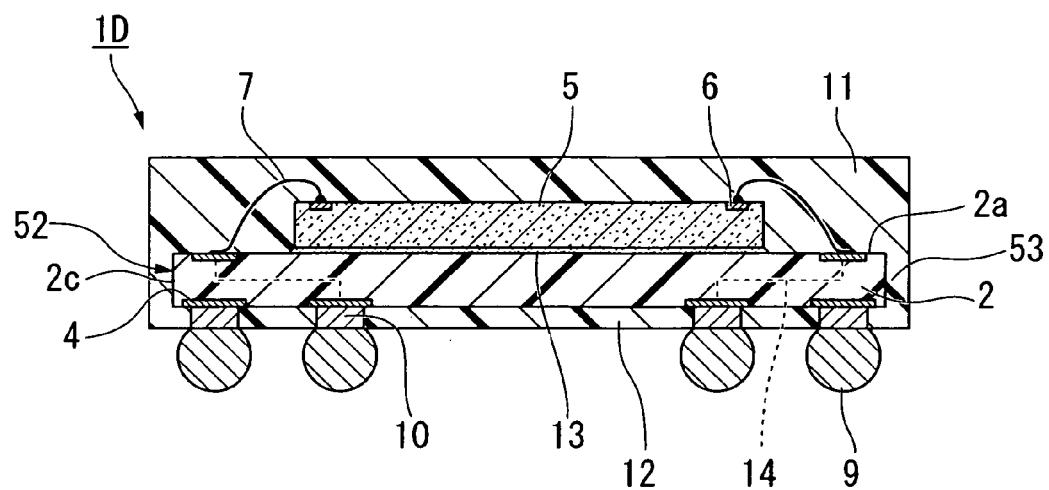
FIG. 15 is a cross-sectional view taken along a line D-D' shown in FIG. 14.
Figure 16:
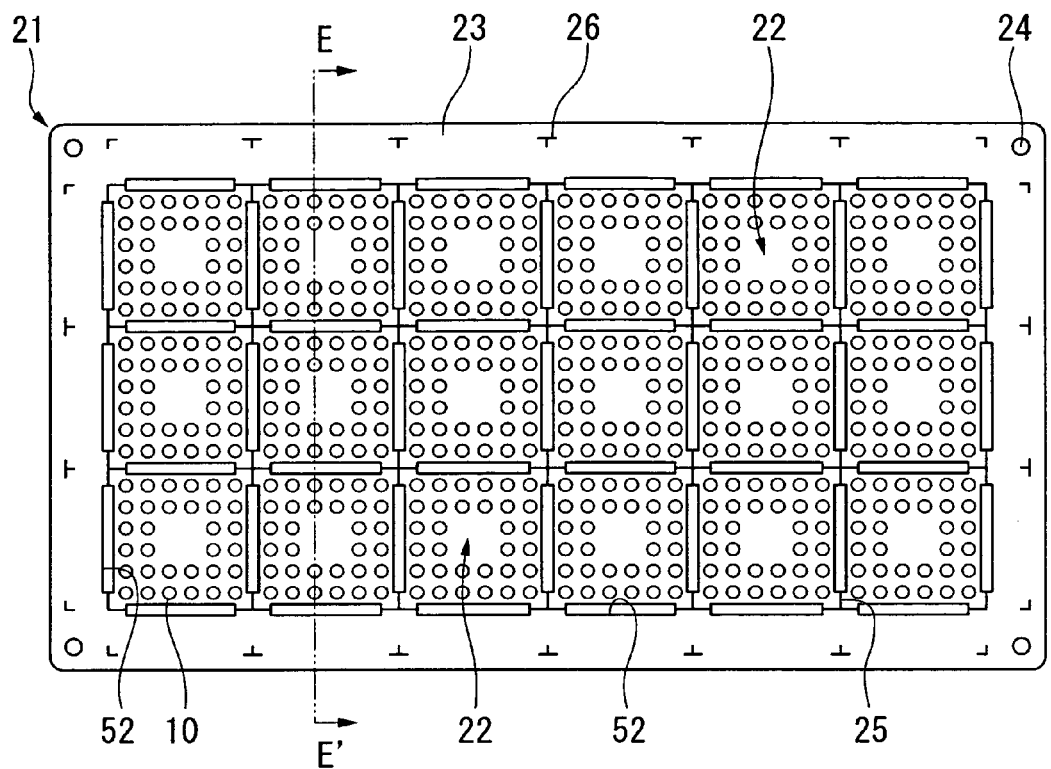
FIG. 16 is a plane view illustrating a rear surface of a wiring motherboard used for manufacturing the semiconductor device according to the fourth embodiment.
Figure 17:
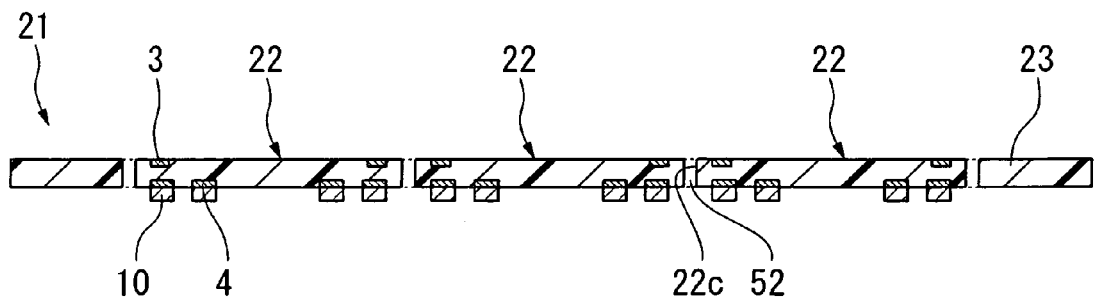
FIG. 17 is a cross-sectional view taken along a line E-E' shown in FIG. 16.

Fourth Embodiment:

FIG. 14 is a plane view illustrating a rear surface of a semiconductor device 1D according to a fourth embodiment of the present invention. FIG. 15 is a cross-sectional view taken along a line D-D' shown in FIG. 14. FIG. 16 is a plane view illustrating a rear surface of a wiring motherboard used for the semiconductor device 1D. FIG. 17 is a cross-sectional view taken along a line E-E' shown in FIG. 16. The fourth embodiment is a modification of the first embodiment, and therefore explanations of like elements are omitted here.

As shown in FIGS. 14 to 17, the semiconductor device 1D includes through slits 52 along side surfaces 2c thereof (i.e., along boundaries among element formation units 22). A third seal 53 connecting the first and second seals 11 and 12 is formed to cover the through slits 52.

In the semiconductor device 1D of the fourth embodiment, the first and second seals 11 and 12 are formed to cover substantially the entire surfaces 2a and 2b of the wiring substrate 2. Accordingly, a balance of thermal expansion between both sides of the wiring substrate 2 is improved, thereby enabling a reduction in warpage of the semiconductor device 1D, similarly to the first embodiment.

Additionally, the third seal 53 is formed to cover the side surfaces 2c of the wiring substrate 2, and the first to third seals 11, 12, and 53 integrally cover the wiring substrate 2, thereby enhancing the humidity resistance of the semiconductor device 1D.

Further, thanks to the through slits 52 formed along side surfaces 2c of the wiring substrate 2 (i.e., along the boundaries among the element formation units 22), the connection area between the wiring substrate 2 and the third seal 53 increases, thereby enhancing the adhesion of the wiring substrate 2 to the third seal 53 connecting the first and second seals 11 and 12.

It is apparent that the present invention is not limited to the above embodiments, but may be modified and changed without departing from the scope and spirit of the invention.

Figure 18:
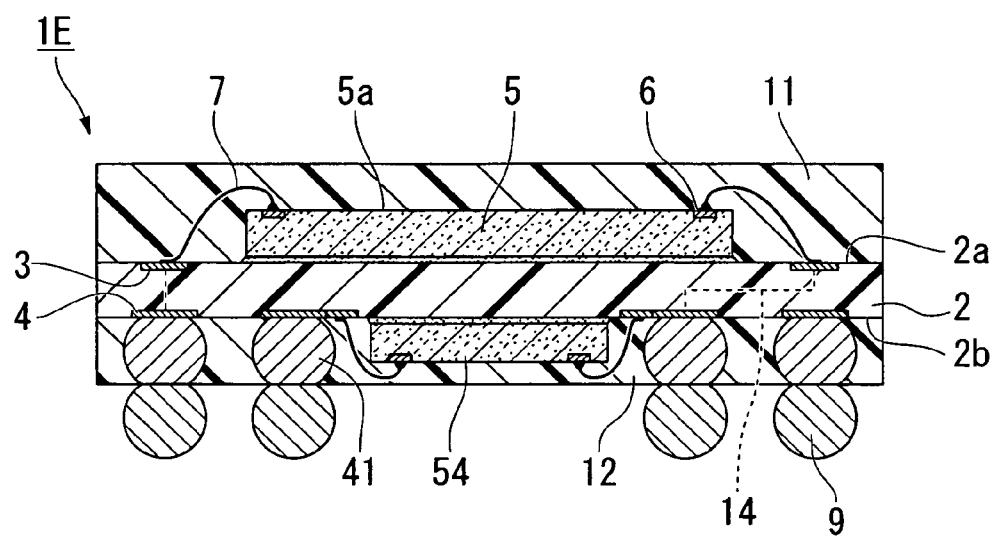
FIG. 18 is a cross-sectional view illustrating a semiconductor chip mounted on a rear surface of the wiring substrate in the semiconductor device.

For example, although it has been explained in the embodiments that one semiconductor chip 5 is mounted on the semiconductor substrate 2, multiple semiconductor chips 5 may be provided in parallel or stacked on the wiring substrate 2. Further, the present invention is applicable to a semiconductor device 1E in which a semiconductor chip 54 is mounted on the rear surface 2b of the wiring substrate 2, as shown in FIG. 18.

Figure 19:
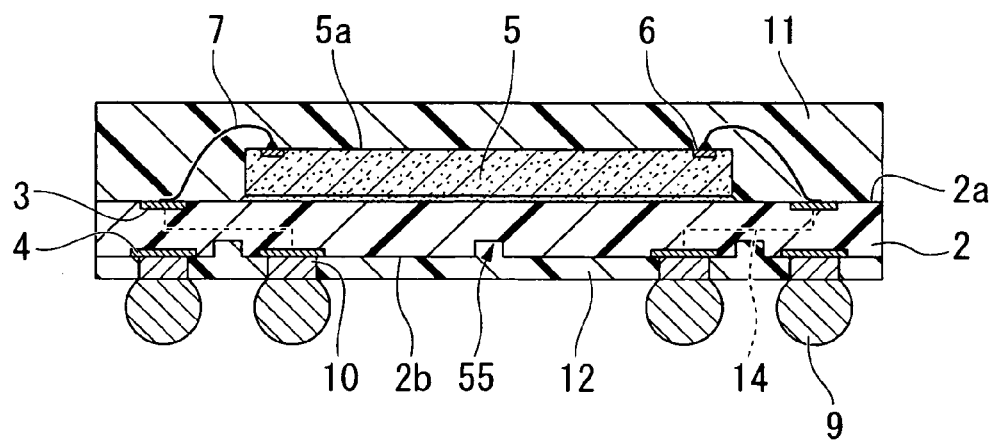
FIG. 19 is a cross-sectional view illustrating a recess provided on the rear surface of the wiring substrate in the semiconductor device.
Figure 20:
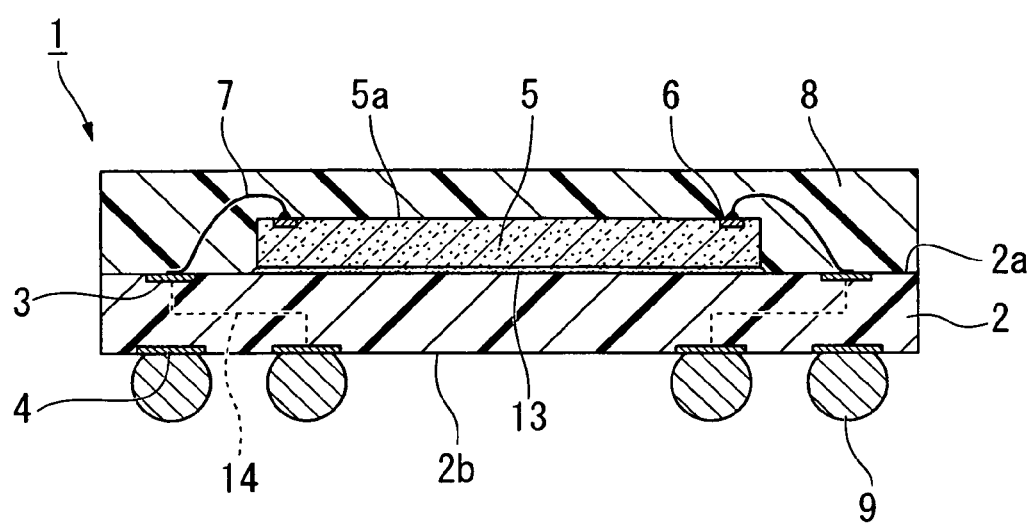
FIG. 20 is a cross-sectional view illustrating a conventional semiconductor device.

Additionally, although it has been explained in the embodiments that the through slits 52 are provided along the side surfaces 2c of the wiring substrate 2 (i.e., along the boundaries among the element formation units 22), recesses 55 may be provided on the rear surface 2b of the wiring substrate 2, as shown in FIG. 19. Consequently, the connection area between the wiring substrate 2 and the second seal 12 increases, and thereby the adhesion increases.

Furthermore, although it has been explained that the wiring substrate 2 is made of a glass epoxy substrate, the wiring substrate 2 may be a flexible substrate made of a polyamide material.

Moreover, although it has been explained that the semiconductor chip 5 and the wiring substrate 2 are connected using the wires 7, the semiconductor chip 5 and the wiring substrate 2 may be connected by a flip chip connection.

The present invention is applicable to semiconductor-device manufacturing industries.

What is claimed is:

1. A semiconductor device comprising:
   a substrate including a first surface, a second surface opposite to the first surface, and a plurality of lands formed on the second surface, and the substrate further including a solder resist film formed on the second surface so as to expose the plurality of lands;
   a semiconductor chip mounted over the first surface of the substrate, the semiconductor chip being electrically connected to the plurality of lands;
   a first seal provided over the first surface of the substrate to cover the semiconductor chip;
   a plurality of conductors provided on the plurality of lands of the substrate, respectively;
   a second seal provided over substantially an entirety of the solder resist film of the substrate so that parts of the plurality of conductors expose from the second seal; and
   a plurality of solder balls connected to the parts of the plurality of conductors,
   wherein the first seal comprises first and second edges that are substantially aligned with first and second edges of the second seal, respectively, and the second seal is continuously formed between the first and second edges of the second seal, and
   wherein the plurality of conductors have a thickness substantially equal to a thickness of the second seal.

2. The semiconductor device according to claim 1, wherein the first seal comprises a first insulating resin having a first thermal expansion coefficient,
   the second seal comprises a second insulating resin having a second thermal expansion coefficient, and
   the first thermal expansion coefficient is nearly equal to the second thermal expansion coefficient.

3. The semiconductor device according to claim 1, wherein the first seal is thicker than the second seal,
   the first seal comprises a first insulating resin having a first thermal expansion coefficient,
   the second seal comprises a second insulating resin having a second thermal expansion coefficient, and
   the first thermal expansion coefficient is smaller than the second thermal expansion coefficient.

4. The semiconductor device according to claim 1, wherein the plurality of conductors and the plurality of solder balls comprise a same material.

5. The semiconductor device according to claim 1, further comprising:
   a second semiconductor chip provided over the second surface of the substrate, the second semiconductor chip being covered with the second seal.

6. The semiconductor device according to claim 1, further comprising:
   a third seal covering side surfaces of the substrate, the third seal continuously connecting the first and second seals.

7. The semiconductor device according to claim 1, wherein a thickness of the first seal from the first surface to a surface of the first seal is different from a thickness of the second seal from the second surface to a surface of the second seal.

8. The semiconductor device according to claim 1, wherein each of the parts of the plurality of conductors includes a plane surface that is substantially coplanar with a surface of the second seal.

9. The semiconductor device according to claim 1, wherein each of the lands includes a surface facing to the substrate, and an entire area of the surface of each of the lands is in contact with the second surface.

10. The semiconductor device according to claim 1, further comprising:
    a connection pad formed on the first surface;
    a first wire formed in the first seal and electrically connecting the semiconductor chip to the connection pad; and
    a wire formed in the substrate and electrically connecting the connection pad to the plurality of lands.

11. The semiconductor device according to claim 1, wherein the plurality of conductors comprises a copper plating having a thickness of 10 μm or greater.

12. The semiconductor device according to claim 1, wherein the plurality of conductors comprises a plurality of cylindrical conductors which separate the plurality of solder balls from the plurality of lands.

13. The semiconductor device according to claim 1, wherein the first and second edges of the first seal and the first and second edges of second seal are substantially aligned with first and second edges of the substrate, respectively.

14. The semiconductor device according to claim 1, wherein the second seal comprises a central portion that is substantially aligned with a central portion of the semiconductor chip.

15. The semiconductor device according to claim 1, wherein the second seal comprises a central portion that is substantially aligned with a central portion of the first seal.

16. A semiconductor device comprising:
    a substrate including a first surface, a second surface opposite to the first surface, and a plurality of lands formed on the second surface, and the substrate further including a solder resist film formed on the second surface so as to expose the plurality of lands;
    a semiconductor chip mounted over the first surface of the substrate;
    a first seal provided over the first surface of the substrate to cover the semiconductor chip;
    a second seal, comprising a same material as the first seal, provided over the solder resist film of the substrate, the substrate being sandwiched between the first seal and the second seal; and
    a plurality of external terminals provided on the plurality of lands of the substrate so that parts of the external terminals protrude from the second seal,
    wherein the first seal comprises first and second edges that are substantially aligned with first and second edges of the second seal, respectively, and the second seal is continuously formed between the first and second edges of the second seal, and
    wherein the plurality of external terminals includes a plurality of conductors having a thickness substantially equal to a thickness of the second seal.

17. The semiconductor device according to claim 16, wherein each of the external terminals comprises a conductor of the plurality of conductors penetrating the second seal and a solder ball connecting the conductor, and
    wherein the solder ball comprises the parts of the external terminals.

18. The semiconductor device according to claim 1, wherein the substrate includes a recess formed in the second surface, and wherein the recess is filled with the second seal.

19. The semiconductor device according to claim 16, wherein the first seal comprises a first insulating resin having a first thermal expansion coefficient, the second seal comprises a second insulating resin having a second thermal expansion coefficient, and the first thermal expansion coefficient is nearly equal to the second thermal expansion coefficient.

20. The semiconductor device according to claim 16, further comprising:

a second semiconductor chip provided over the second surface of the substrate, the second semiconductor chip being covered with the second seal.

21. The semiconductor device according to claim 16, wherein a thickness of the first seal from the first surface to a surface of the first seal is different from a thickness of the second seal from the second surface to a surface of the second seal.

22. The semiconductor device according to claim 16, wherein each of the conductors includes a plane surface that is substantially coplanar with a surface of the second seal.

23. The semiconductor device according to claim 16, wherein the first and second edges of the second seal are substantially aligned with first and second edges of the substrate, respectively.

24. The semiconductor device according to the claim 16, wherein each of the lands includes a surface facing to the substrate, and an entire area of the surface of each of the lands is in contact with the second surface.

25. A semiconductor device comprising:

a substrate including a first surface, a second surface opposite to the first surface, and a plurality of lands formed on the second surface, and the substrate further including a solder resist film formed on the second surface so as to expose the plurality of lands;

a semiconductor chip mounted over the first surface of the substrate, the semiconductor chip being electrically connected to the plurality of lands;

a first seal provided over the first surface of the substrate to cover the semiconductor chip;

a second seal provided over the solder resist film of the substrate, the substrate being sandwiched between the first seal and the second seal; and a plurality of conductors provided on the plurality of lands of the substrate so that parts of the conductors expose from the second seal, wherein the first seal comprises first and second edges that are substantially aligned with first and second edges of the second seal, respectively, and the second seal is continuously formed between the first and second edges of the second seal, and wherein the plurality of conductors have a thickness substantially equal to a thickness of the second seal.

26. The semiconductor device according to claim 25, wherein each of the lands includes a surface facing to the substrate, and an entire area of the surface of each of the lands is in contact with the second surface.

* * * * *